United States Patent [19]

Murray et al.

[11] Patent Number: 4,724,378
[45] Date of Patent: Feb. 9, 1988

[54] CALIBRATED AUTOMATIC TEST SYSTEM

[75] Inventors: Donald F. Murray, Portland; Steven K. Sullivan, Beaverton, both of Oreg.

[73] Assignee: Tektronix, Inc., Beaverton, Oreg.

[21] Appl. No.: 888,906

[22] Filed: Jul. 22, 1986

[51] Int. Cl.⁴ .................. G01R 31/00; G01R 31/28
[52] U.S. Cl. ....................... 324/73 R; 324/73 AT; 324/74; 371/20; 371/25
[58] Field of Search ................. 324/73 R, 73 AT, 74, 324/158 P, 130; 371/20, 25; 364/571; 73/1 R

[56] References Cited

U.S. PATENT DOCUMENTS

| 4,099,240 | 7/1978 | Rode et al. | 364/571 X |
| 4,125,763 | 11/1978 | Drabing et al. | 324/73 R |
| 4,354,268 | 10/1982 | Michel et al. | 324/73 R X |
| 4,590,422 | 5/1986 | Milligan | 324/158 P |
| 4,635,256 | 1/1987 | Herlein | 371/20 X |
| 4,637,020 | 1/1987 | Schinabeck | 324/73 R X |

Primary Examiner—Ernest F. Karlsen
Assistant Examiner—Vinh P. Nguyen
Attorney, Agent, or Firm—William O. Geny; Allston L. Jones; Robert S. Hulse

[57] ABSTRACT

A calibrated automatic test system includes a test station for generating digital test function codes and a test head containing a plurality of I/O pins for connection to a device under test. Each I/O pin includes a pin electronics circuit responsive to the digital test function codes for providing test signals to the device under test. The pin electronics circuits are inexpensive CMOS IC's and lack the accuracy needed to test VLSI devices at the frequencies of interest. An external calibration unit is connected to each I/O pin and data measurements are taken which represent the performance of the CMOS IC's. The data measurements are converted to calibrated function codes representing desired data values which are then stored in correction memory circuits which respond to nominal digital test function codes and substitute in their places calibrated function codes which are then supplied to the pin electronics circuits.

14 Claims, 7 Drawing Figures

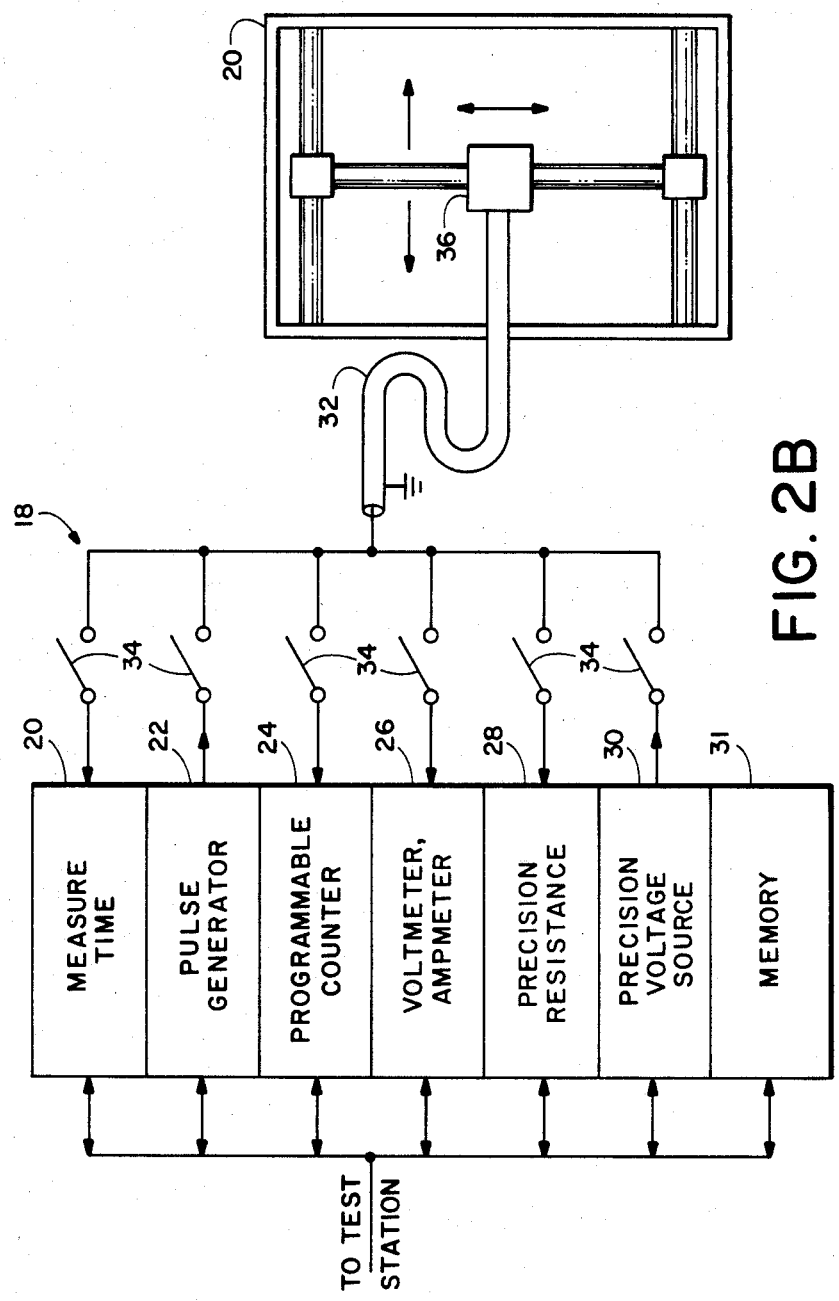

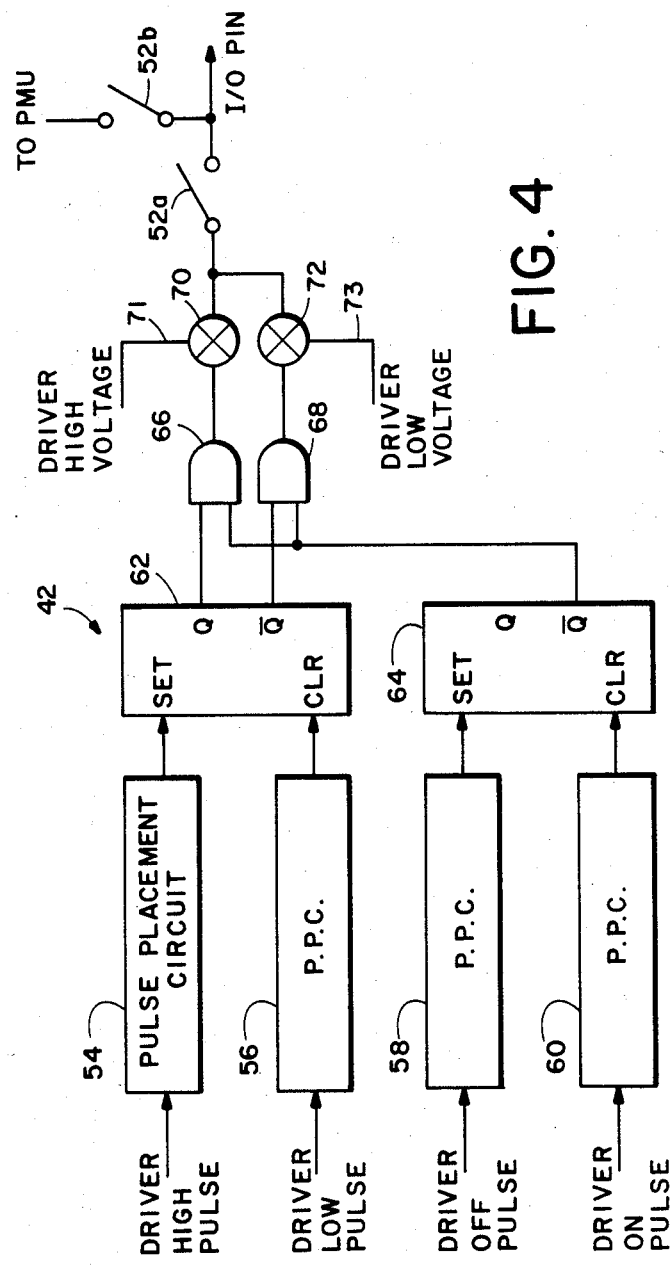

CALIBRATED AUTOMATIC TEST SYSTEM

BACKGROUND OF THE INVENTION

The following invention relates to an automatic test system for testing electronic devices and having a calibration feature for ensuring the accurate generation of test signals for a device under test.

The designing of a test system for VLSI devices presents special engineering problems. To test VLSI devices what is needed are testers with as many as 256 I/O channels, 50 MHz clock and data rates, subnanosecond timing resolution and large test pattern memories associated with each of the 256 I/O channels. Currently test systems that satisfy these criteria are extremely expensive. This is due to the fact that the best architecture for such testers requires redundant sets of tester electronics, one for each output pin of the tester. This is referred to as tester-per-pin architecture. This duplication of circuitry is desirable because with it the problems of multiplexing and cabling, that would otherwise arise with shared test circuitry, are avoided and the test circuits can be located physically adjacent each input/output pin in close proximity with the device under test. Moreover, complex test patterns may be generated since each of the input/output pin circuits are independent and have independent timing generation and output pattern acquisition.

The problem with tester-per-pin architecture is that the redundance of the pin circuits makes the test instrument very expensive. The pin electronics circuits must include precision components which ensure accuracy of all relevant electrical parameters. Duplicating these types of circuits results in a considerable increase in the overall cost of the unit.

SUMMARY OF THE INVENTION

The present invention provides an automatic test system which has the flexibility of tester-per-pin architecture but which can be produced at a relatively modest cost.

A calibrated automatic test system for testing electronic devices comprises a programmable test station which includes a test head having a plurality of input/output pins for connection to a device under test. CMOS integrated pin circuits are provided for each of the I/O pins for generating the signals needed to stimulate the device under test. An external calibration unit which is selectively connectable to the test head receives test signals from the CMOS integrated pin electronics circuits and derives from those test signals error correction signals which may be used to calibrate the CMOS IC's in each of the individual pin electronics circuits.

Although tester-per-pin architecture is utilized in the present system, it is less expensive because of the incorporation of monolithic CMOS integrated circuits for each of the pin electronics circuits. The use of CMOS IC's would ordinarily subject the tester to a host of inaccuracies due to the variations in circuit parameters that result from the manufacturing processes used to make the IC's. However, the external calibration unit solves this problem by measuring the test signals generated by each of the pin electronic circuits, stores those signals in a memory, and utilizes the signals in the memory to provide error correction factors for calibrating the IC's.

The test unit, which may be under the control of a host computer, generates test signals through digital function codes which are provided to each of the pin electronic circuits. The pin electronic circuits are responsive to error correction memory circuits which provide error correction signals derived by the external calibration unit for altering the test function digital codes thereby producing calibrated test signals at the output of each pin electronics circuit.

The external calibration unit may be portable and thus may be used with several test stations, and may include an X-Y positioning apparatus for making selective connection with each I/O pin of the test head for calibrating each pin electronics circuit in turn.

It is a principal object of this invention to provide an automatic tester for electronic devices having the advantages of tester-per-pin architecture, including the requisite accuracy, while avoiding the cost usually associated with such architecture.

The foregoing and other objectives, features and advantages of the present invention will be more readily understood upon consideration of the following detailed description of the invention taken in conjunction with the accompanying drawings.

BRIEF DESCRIPTION OF THE DRAWINGS

FIG. 2b is a block schematic diagram of the external calibration unit of FIG. 2.

FIG. 4 is a blcok schematic diagram of the driver block of FIG. 3.

DETAILED DESCRIPTION OF THE INVENTION

Figure 1:
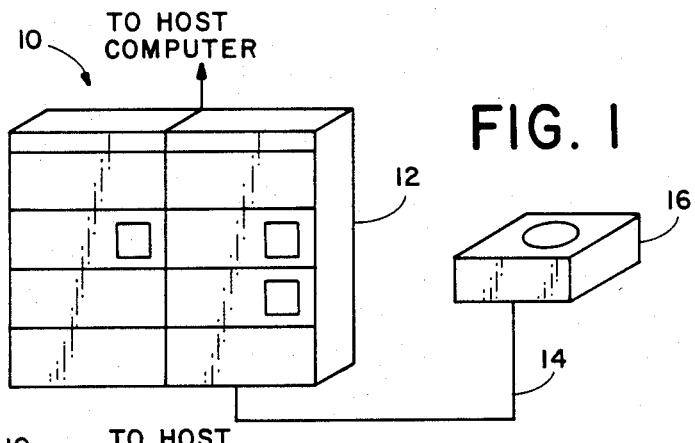
FIG. 1 is a perspective drawing of an automatic test station under control of a host computer and including a test head for connection to a device under test.

An automatic test unit 10 includes a test station 12 which includes programmable test circuitry under the control of a host computer (not shown) for generating digital test function codes over a connecting cable 14 to a test head 16. The test head 16 may be loaded with a device under test (not shown) such as a VLSI chip which may have as many as 256 input/output lines. Each I/O line is connected to the device under test by a pin (not shown) and each of the pins includes a pin electronics circuit 38 (refer to FIG. 3) to provide test signals to the device under test in response to digital test function codes generated by the the test station 12.

In order to calibrate the pin electronics circuits 38 in the test head 16, the automatic test system includes an external calibration unit 18 which may include an X-Y positioning device 20 which may be positioned to connect to various pins of the test head 16. The positioning device may include a probe head 36 which may move in two dimensions as shown by the arrows in FIG. 2b. The external calibration unit 18 is shown in more detail in FIG. 2b, and comprises several modules including a time measurement circuit 20, pulse generator 22, programmable counter 24, volt meters and ammeters 26, precision resistances 28, and precision voltage sources 30. They are connectable to an X-Y positioning device 20, by way of coaxial cable 32. A series of relays 34 selectively connect the modules of the external calibration unit 18 to the coaxial cable 32 except for a memory unit 31 which is internally connected to the other circuits. The external calibration unit 18, with its associated X-Y positioning device 20, may be portable and may be mounted in a cart or rack having wheels (not shown) so that it can be moved about from one test unit 10 to another. This provides for additional economy of the system because only one external calibration unit 18 may be needed for a plurality of test units 10.

Figure 3:
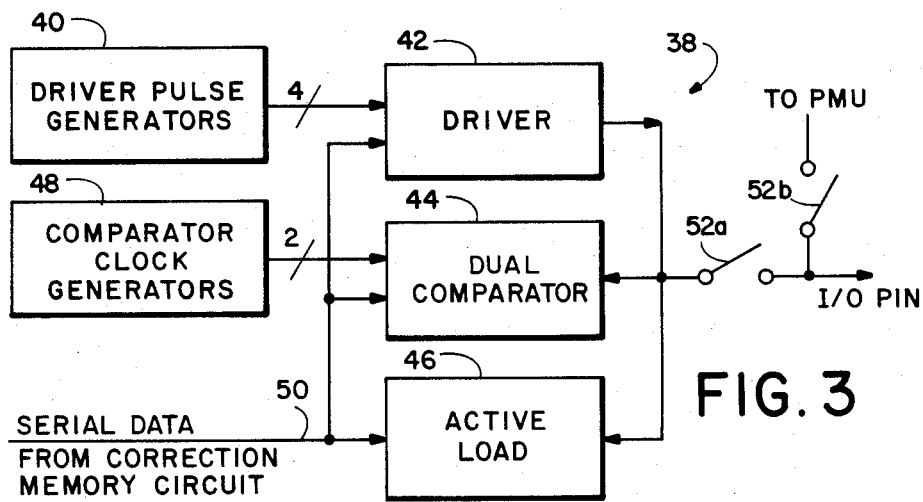
FIG. 3 is a block diagram schematic diagram of one of the pin electronics circuits located in the test head of FIG. 1.

A block schematic diagram of the pin electronics circuit 38 for one of the I/O pins of test head 16 is shown in FIG. 3. The circuits represented by the block diagram of FIG. 3 may be contained on two monolithic CMOS integrated circuit chips. These must be small-geometry CMOS chips to fit within test head 16 adjacent each of the I/O pins, and, as a consequence, exhibit large variations in performance characteristics at the speeds at which test signals must be transmitted and acquired for VLSI testing. These speeds typically approach 50 MHz. Thus, while the pin electronics circuits 38 may be placed adjacent the pins of the test head 16, they must be calibrated if the system is to remain accurate.

The CMOS pin electronics circuit 38 includes driver pulse generators 40 which provide pulses for a driver circuit 42. The driver 42 provides timed output pulses which stimulate the device under test. Signals from the device under test are acquired by a dual comparator 44 and an active load circuit 46. The dual comparator 44 is controlled by comparator clock generators 48. The driver 42, the dual comparator 44 and the active load 46 are controlled by digital test function codes from incoming serial data line 50. Serial data line 50 is connected to the output of a correction memory circuit as will be explained below. A pair of relays 52a and 52b connect either the pin electronics circuit 38 or a parametric measurement unit (not shown) to one of the input/output pins of test head 16. The parametric measurement unit is a DC measuring device which may be shared among a plurality of pin electronics circuits 38 and which may be used to measure various DC characteristics of a device under test.

A more detailed schematic diagram of the driver circuit 42 is shown in FIG. 4. The driver pulse generators 40 include four output lines which are seen in FIG. 4 as input lines labelled "driver high pulse," "driver low pulse," "driver off pulse," and "driver on pulse." These lines are connected to pulse placement circuits 54, 56, 58 and 60, respectively. Pulse placement circuits 54 and 56 provide inputs to flip flop 62, and pulse placement circuits 58 and 60 provide inputs to flip flop 64. The outputs of flip flop 62 and 64 are provided to AND gates 66 and 68. The output of AND gates 66 and 68 are connected to transmission gates 70 and 72 respectively, which gate either a driver high voltage rail 71 or a driver low voltage rail 73 through relay 52a. The driver circuit 42 may thus have three states: it may provide a logical high signal, a logical low signal or it may be turned off.

For testing purpose, the timing of the leading edges of the driver circuits 42 in all of the pin electronics 38 may be critical. For example, it may be desirable to time all of the leading edges of pulses produced by the drive circuits 42 so that they all occur within a certain number of nanoseconds relative to a reference determined by a master clock located in test station 12 or in the host computer. This process is known as deskewing the input drivers and makes it possible to generate test pulses that arrive simultaneously on all input pins of interest in the test head 16.

Figure 5:
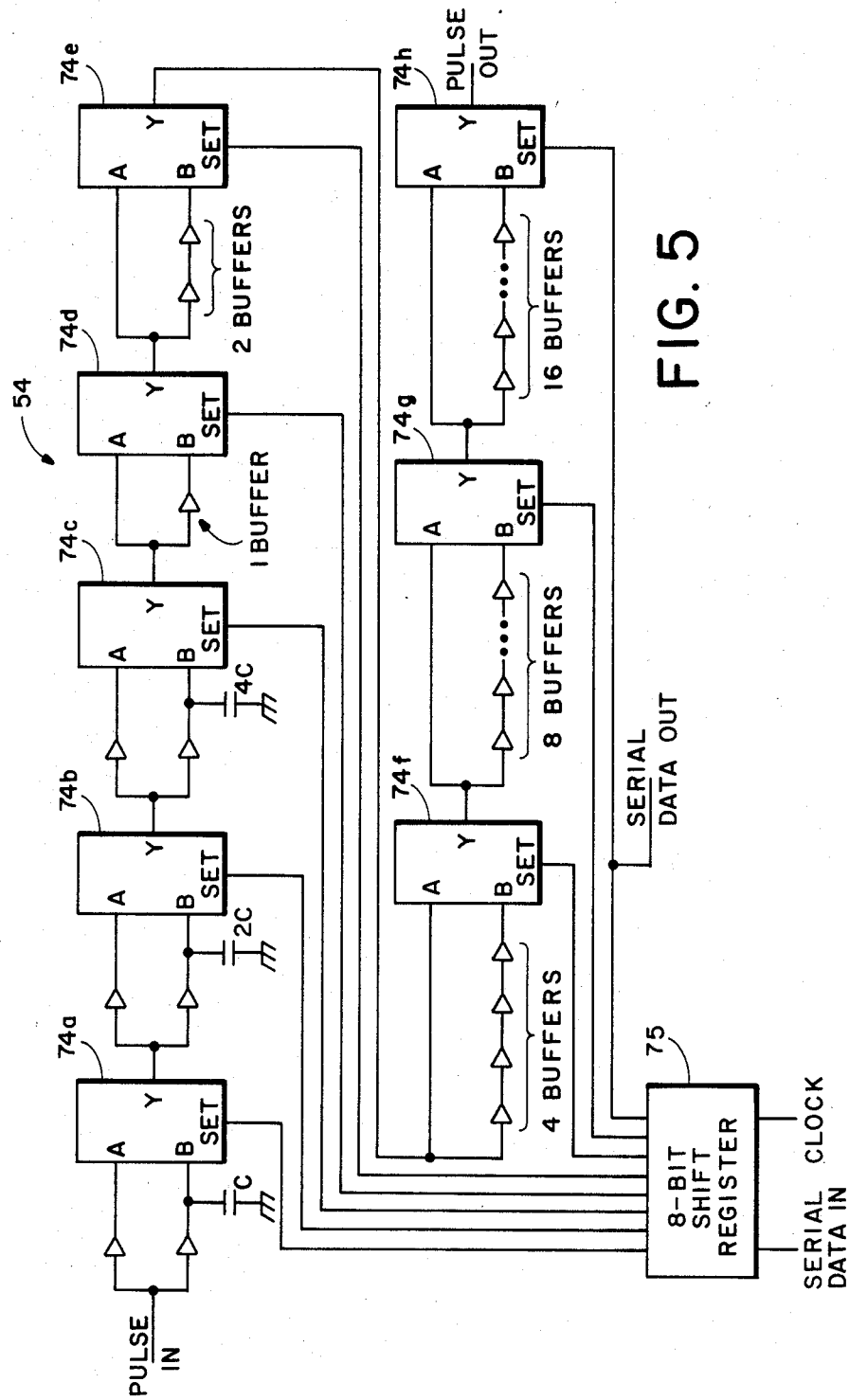
FIG. 5 is a block schematic diagram of one of the pulse placement circuit blocks of FIG. 4.
Figure 6:
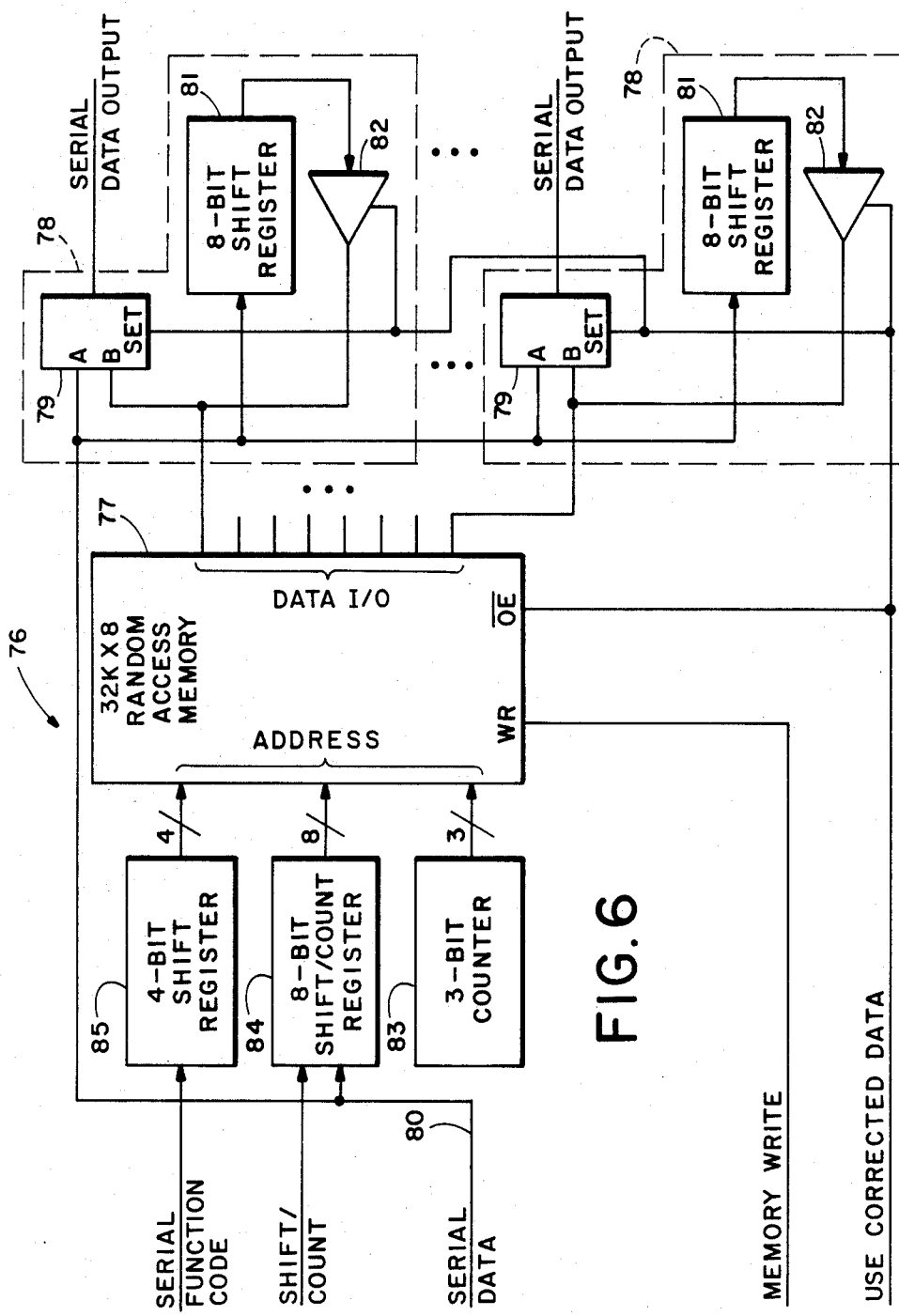
FIG. 6 is a block schematic diagram of an error correction memory for use with the pin electronics circuit shown in FIG. 3.

In order to adjust the timing of the leading edges of pulses produced by the driver circuit 42, the pulse placement circuits 54, 56, 58 and 60 are arranged so as to provide variable delays which may be adjusted by an 8-bit digital signal. The circuit for implementing driver pulse timing adjustability is shown in FIG. 5. The pulse placement circuit shown in FIG. 5 includes a plurality of multiplexers 74a through 74h. Each one of the multiplexers 74a–74h is connected to one of the lines of an 8-bit shift register 75. The lines from shift register 75 are connected to the SET inputs of multiplexers 74a–74h and choose, depending upon the state of the line, that is, whether a logical high or a logical low, either input A or B. The B input on each of the multiplexers 74a–74h is generally configured to provide more delay to the signal input. For example, in multiplexers 74a, 74b and 74c, a capacitor connected in parallel with the B input provides additional delay. In multiplexers 74d–74h pluralities of buffer amplifiers provide increased delay for the B input as opposed to the A input. The digital code loaded into shift register 75 controls the choice at each of the multiplexers 74a–74h of the A or B input and thereby chooses the amount of delay through the pulse placement circuit 54. The "serial data in" line connected to the shift register 75 is from the output of an error correction circuit which is shown in FIG. 6. The error correction circuit, such as circuit 76 shown in block diagram form in FIG. 6, includes an output for each of the pin electronic circuits such as circuit 38 shown in FIG. 3.

Referring to FIG. 6, an error correction memory circuit includes a random access memory 77 which is configured, by way of example only, as a 32k×8 random access memory. For test heads having 256 input/output pins, the memory 77 would be configured as a 32k×256 RAM. Each data I/O line of RAM 77 is connected to a data output circuit 78. There will be as many data output circuits 78 as there are pins for the test head 16 and, consequently, there will be the same number of pin electronics circuits 38. Each data output circuit 78 includes a multiplexer 79 having its B input connected to the data I/O port of RAM 77 and its A input line connected to a serial data input line 80. The serial data line 80 is also connected to an 8-bit shift register 81 which has an output leading to a tristateable buffer amplifier 82. The tristateable buffer amplifier 82 is also connected to the SET input of multiplexer 79 and to a node between the data I/O outputs of RAM 77 and the B input of multiplexer 79. Connected to the address lines of RAM 77 are a 3-bit counter 83, an 8bit shift-/count register 84, and a 4-bit shift register 85. The 4-bit shift register 85 has an input which provides a serial function code, and the 8-bit shift/count register 84 has a shift/count input line controlling the function of the register 84, that is, whether it functions as a shift register or as a counter.

The purpose of the RAM 77 is to store corrected test function codes in address locations that may be accessed by nominal test function codes generated by the test modules included at test station 12. The test function codes may instruct the pin electronic circuits 38 to perform various test functions such as, for example, generating a test pulse at a time relative to some standard. Because of the variations in performance of the CMOS integrated circuits which contain the pin electronics circuits 38, the actual timing of such a pulse called for by a specific test function code, may not occur at the desired time. The correction memory circuit 76 provides correct test function codes which may be substituted for the function codes generated from the test station 12 so that the performance of the pin electronics circuits 38 corresponds to the actual desired performance.

Figure 2:
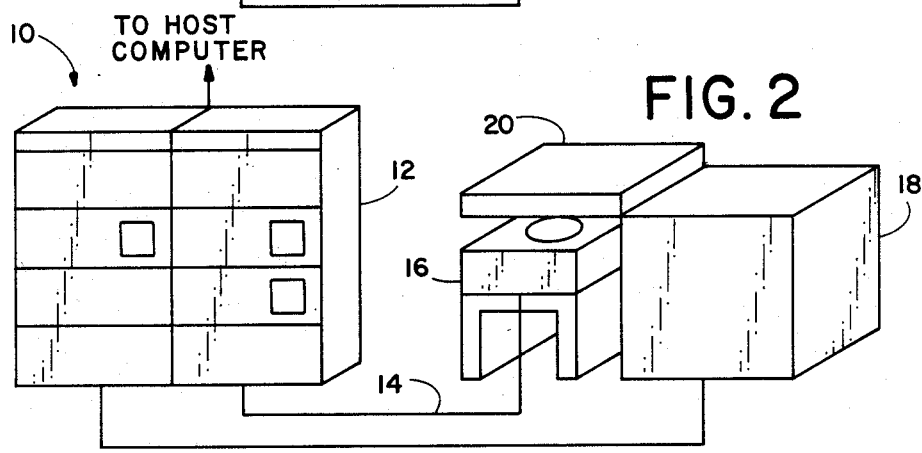
FIG. 2 is a perspective drawing of the test station of FIG. 1 with an external calibration unit positioned to make electrical contact with the test head.

In order to provide the corrected test function codes that are stored in RAM 77, the external calibration unit 18 is positioned over the test head 16 as shown in FIG. 2. The X-Y positioning unit 20 is connected to each I/O pin of the test head 16 in turn, and measurements are taken which record the actual performance of each of the pin electronics circuits 38 in response to test function codes generated from the test station 12. For example, the timing of the driver pulses from driver circuit 42 is controlled by the pulse placement circuit 54. This circuit is controlled in turn by an 8-bit shift register 75 which receives a test function code from test station 12. Since shift register 75 is an 8-bit register, there may be as many as 256 possible values for the timing of the leading edge of drive pulses for drive circuit 42. The host computer connected to each test station 12 may determine which test functions are to be implemented and analyzes the test data that is received, and may control the operation of the external calibration unit 18.

Thus, under control of the host computer, the test station 12 initiates a test of the driver leading edge timing and proceeds to provide the pin electronics circuit 38 with each of the 256 possible values for the timing of the output of the driver circuit 42. When this occurs, the RAM 77 in the correction memory circuit 76 is turned off and the output of the circuits 78 comprises serial data from the serial data input line 80. The calibration unit 18 records the actual timing data resulting from the 256 test function codes in its memory 31. Next, the host computer determines a desired data value which may, for example, be the timing of a pulse relative to a reference standard. It searches the memory 31 for the data entry that most closely aproximates the desired performance of the circuit. Once this data entry has been looked up in the memory 31, its test function code is determined and that code is transferred to a location in RAM 77 which has an address which may be accessed by the nominal test function codes produced by the test station 12.

For example, the memory 31 may store all 256 possible values for the timing of the leading edge of a driver pulse relative to a reference. If the drivers 42 were to be deskewed so that all drivers 42 timed the leading edges of their output pulses to occur 10 nanoseconds after a predetermined clock or reference, the host computer would perform a table lookup in the memory 31 for a data value that represented most closely the desired 10 nanosecond timing relationship. The function code that produced this data value would then be stored in the error correction RAM 77.

This data is written into the RAM 77 by turning off the data I/O lines and loading the data into 8-bit shift register 81. The data is placed in the memory on one of the data I/O lines through tristateable buffer 82. At the same time, the "memory write" line of RAM 77 is enabled, and the "use corrected data" line on input OE is turned off which inhibits the output of the data I/O lines. The function code that produced the 10 nanosecond timing is placed in an address location in the RAM 77 where it will be accessed by the function code from test station 12 that nominally produces the 10 nanosecond timing relationship. When this has been done for all test functions of interest, RAM 77 will contain calibrated test function codes which may be substituted for incoming nominal test function codes.

Once the system has been calibrated, the external calibration unit 18 may be removed from the test head 16. A function code entering on serial data line 80 will enter 8-bit shift/count register 84. At the same time, a serial function code determines which one of 16 possible test function types is being called up out of memory. The output of the shift/count register 84 will be an address location which contains the calibrated test function code which, in the present example, will cause the pin electronics circuits 38 to provide the desired pulse timing for the driver circuits 42. The corrected function code will therefore be substituted for the nominal test function code entering on serial data line 80. The corrected test function code will be serially loaded into multiplexer 79 one bit at a time by 3-bit counter 83. At the same time, the data I/O lines of RAM 77 are turned on by the "use corrected data" input, which also turns off tristateable buffers 82 and selects line B of multiplexers 79. The substituted 8-bit test function code on the serial data output line forms the serial data input to the 8-bit shift register 75 (refer to FIG. 5) which, as explained above, sets the timing for the pulses of driver circuit 42 in each of the in electronic circtuis 38 (refer to FIG. 3).

The invention has thus been explained by reference to an example in the pin electronics circuits 38 involving the timing of the leading edge of output pulses from driver circuits 42. It should be understood, however, that the other circuits in the pin electronics circuits 38, such as the dual comparators 44 and the active loads 46, also require calibration and thus have inputs from the serial data line 50 from the correction memory unit 76 shown in FIG. 6. For example, there are offset and linearity errors that are introduced by digital to analog (DAC) circuits in dual comparator 44. The voltage produced by the DACs also depends upon digital test function codes generated in the test station 12. Similarly, the active load circuits 46 are used to sink or source current to a device under test and depend upon other DAC voltages in their respective circuits which in turn depend upon digital codes at the input of the DACs.

While the invention has been described as a calibration unit for monolithic CMOS integrated circuits which are used as pin electronics circuits, the invention is applicable to any type of electronic circuit which inherently lacks the accuracy required for VLSI testing at speeds in the 50 MHz range. The calibration system of the instant invention is applicable to any other type of electronic circuit which requires calibration for accurate testing, and there is no intent to limit the invention described herein solely to CMOS integrated circuits.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. An automatic test system for testing an electronic device comprising:
   a. a programmable test station for generating test function digital codes;
   b. a test head having:
      a plurality of output pin means for connection to a device disposed to be tested; and
      a plurality of CMOS integrated circuit means, a different one of which is coupled to each of said plurality of output pin means, each for providing test signals to a different pin of said device under test;
   c. external calibration means selectively connectable to each of said output pin means of said test head for receiving said test signals and for deriving therefrom error correction factors for calibrating each of said CMOS integrated circuit means; and
   d. error correction memory means for storing said error correction factors therein and for altering said test function digital codes from said test station with said error correction factors to produce intermediate signals which cause the correct test signal to be applied to each output pin when said intermediate signals are each applied to said plurality of CMOS integrated circuit means.

2. The automatic test system of claim 1 wherein said external calibration means is portable and includes X-Y positioning means for selectively connecting said external calibratin means to selected ones of said output pin means.

3. An automatic test system for testing electrical devices comprising:
   a. a programmable test station for generating test functions represented by digital test codes;
   b. test head means coupled to said test station for providing output means for connection to a device disposed to be tested;
   c. a plurality of circuit means, one for each output means of said test head means for providing test data to said device under test in response to calibrated digital test codes;
   d. calibration means selectively connectable to said test head for deriving calibrated digital test codes to be selectively substituted for said digital test codes generated by said test station; and
   e. error correction memory means for storing said calibrated digital test codes.

4. The automatic test system of claim 3 wherein said calibration means comprises an external portable unit including positioning means for selectively connecting said unit to each output means of said test head means.

5. The automatic test system of claim 3 wherein said calibration means comprises means for measuring test data provided to each of said output means by said circuit means in response to said digital test codes, and further including memory means for storing said data.

6. The automatic test system of claim 5, further including means for looking up in said memory means data respresenting predetermined performance characteristics of said circuit means, for deriving said calibrated digital test codes therefrom, and for storing said calibrated digital test codes in said correction memory means whereby the generation of predetermined once of said digital test codes triggers said correction memory means to substitute said calibrated digital test codes therefor.

7. The automatic test system of claim 6 wherein said circuit means comprise CMOS integrated circuit.

8. An automatic test system for testing electrical devices comprising:
   a. a programmable test station;
   b. a multipin connector controlled by said test station, said multipin connector including electronic circuits for each pin of said connector for executing predetermined test functions;
   c. correction memory means associated with each of said electronic circuits for providing codes representing calibrated test functions; and
   d. external calibration means selectively connectable to said multipin connector for determining said codes to be stored in said correction memory means.

9. The automatic test system of claim 8 wherein said external calibration means comprises X-Y probe means for connection to said multipin connector, one pin at a time.

10. The automatic test system of claim 9 wherein said external calibration means includes means for measuring preselected data parameters of signals generated by said electronic circuits and for causing said data parameters to be stored in a memory.

11. The automatic test system of claim 10, further including means for determining function codes for said data parameters and for loading preselected ones of said function codes into said correction memory means to replace nominal function codes generated by said programmable test station.

12. The automatic test system of claim 11 wherein said correction memory means include multiplexing means for permitting selection between the contents of said correction memory means and uncorrected function codes generated by said programmable test station.

13. A method of calibrating an automatic test system for testing electrical devices comprising the steps of:
   a. connecting a calibration circuit including a memory to an output pin of said automatic test system;
   b. initiating a plurality of test functions from said automatic test system, each having a distinct digital code;
   c. applying said distinct digital codes of step b. to said output pin;
   d. measuring the data produced at said output pin by each of said distinct digital codes with said calibration circuit and storing said data is said memory;
   e. determining a desired data value at said output pin for each of said distinct digital codes;
   f. determining a data correction factor from the measured data of step d. and the desired data value of step e. for each distinct digital code applied to said output pin in step c.; and
   g. storing said data correction factor in an error correction memory associated with said output pin of said automatic test system.

14. The method of claim 13 further includes the step:
   h. repeating steps a. through g. for each output pin of the automatic test system.

* * * * *